(12) United States Patent
Nightingale

(10) Patent No.: US 6,466,000 B1
(45) Date of Patent: Oct. 15, 2002

(54) REPLACEABLE PROBE TIP HOLDER AND MEASUREMENT PROBE HEAD

(75) Inventor: Mark W. Nightingale, Washougal, WA (US)

(73) Assignee: Tektronix, Inc., Beaverton, OR (US)

( * ) Notice: Subject to any disclaimer, the term of this patent is extended or adjusted under 35 U.S.C. 154(b) by 98 days.

(21) Appl. No.: 09/607,574

(22) Filed: Jun. 29, 2000

Related U.S. Application Data

(60) Provisional application No. 60/208,945, filed on May 31, 2000.

(51) Int. Cl.[7] .................................................. G01R 31/02
(52) U.S. Cl. ...................................... 324/72.5; 324/149
(58) Field of Search .............................. 324/149, 762, 324/758, 724, 72.5, 754, 761

(56) References Cited

U.S. PATENT DOCUMENTS 4,783,624 A * 11/1988 Sabin .......................... 324/149
5,061,892 A * 10/1991 O'Hara et al. .............. 324/149

* cited by examiner

*Primary Examiner*—Edward Lefkowitz
*Assistant Examiner*—Subhash Zaveri
(74) *Attorney, Agent, or Firm*—William K. Bucher

(57) ABSTRACT

A replaceable probe tip holder for an associated low capacitance probe head has a cap with a series of cavities formed therein and a bore extending from the inter most cavity to the front end of the cap. A first cavity receives the probe head tubular housing, a second cavity receives a portion of the probe head substrate extending from the housing, and a third cavity receives a first resilient compression member and a first electrically conductive probing tip having a shank and a head. The head is disposed in the third cavity in contact with the first resilient compression member and shank extends through the bore with the end of the shank extending from the front end of the cap. Attachment arms extend from the back end of the cap and are positionable on the outside of the housing. The replaceable probe tip holder may also be configured with differential probing tips having two electrically conductive probing tips extending from the cap.

35 Claims, 4 Drawing Sheets

REPLACEABLE PROBE TIP HOLDER AND MEASUREMENT PROBE HEAD

CROSS-REFERENCE TO RELATED APPLICATION

This application claims the benefit of the U.S. Provisional Application No. 60/208,945, filed May 31, 2000.

BACKGROUND OF THE INVENTION

The present invention relates generally to measurement probes and more specifically to a replaceable probe tip holder for a wide bandwidth, high frequency measurement probe, such as used with measurement test equipment like oscilloscopes, logic analyzers and the like.

A typical measurement probe is described in U.S. Pat. No. 5,061,892 for acquiring electrical signals from a device under test in the megahertz range. The probe has probe head with an electrically conductive hollow tube having a substrate disposed therein. The substrate has passive and/or active circuitry to prevent loading of the test device. The end of the hollow tube has an insulating plug disposed therein with a coaxially disposed probing tip extending out of the plug in both directions. The portion of the probing tip extending into the hollow body is electrically connected to the substrate by a spring loaded electrical contact electrically connected to the substrate. A damaged or broken probe tip may be replaced by replacing the plug and associated probe tip. One drawback to this type of probe design is limited bandwidth of the probe caused by the capacitance of the probe tip and the spring loaded electrical contact. At high frequencies, measures need to be taken to minimize the probe tip capacitance.

High frequency measurement probes, such as for probing signals in the 3 Ghz to 4 Ghz range, require high input resistance values and low input capacitances. Generally, these types of probes have an active FET input for low circuit loading and have a frequency bandwidth up to 4 Ghz or more. An example of such a probe is the P6217 Active FET Probe, manufactured and sold by Tektronix, Inc., Beaverton, Oreg. and assignee of the instant application.

FIG. 1 is a cross-sectional view of the P6217 probe 10 showing the internal configuration of the probe elements. The probe 10 has an electrically conductive circular tubular housing 12 in which is disposed a substrate 14. The substrate is slightly off center in the tubular housing so that the upper surface of the substrate is centered in the housing. The end of the substrate 14 is tapered to provide clearance for a probe tip holder 16 and extends slightly outward from the end of the tubular housing approximately 0.025 inches. Passive and active electrical components 18, such as FET transistors, resistors, capacitors and the like are mounted on the substrate. A gold foil contact 20 extends over the front end of the substrate 14 for providing an electrical connection between the substrate 14 and a probing tip 22. The probe tip holder 16 is made of insulating material, such as plastic or the like, is secured within the end of the housing 12. The holder 16 has a cavity 24 with a tapered end 26 that receives a portion of the substrate 14 extending out past the end of the housing 12. The tapered end 26 is centrally formed in the holder 16 and has a bore 28 extending therefrom to the front end of the holder 16. The probing tip 22 has a head 30 and a shank 32 that is disposed in the holder 22 with the head 30 positioned in the tapered end 26 and the shank 32 extending through the bore 28 with the tip of the shank 32 exposed at the front end of the holder 16. A resilient elastomeric member 34 is disposed in the tapered end 26 between the probing tip head 30 and the holder to provide a compressive force between the head 30 and the gold foil contact 20 on the end of the substrate 14. An insulating boot 36 is positioned over a substantial portion of the tubular housing 12 to electrically insulate the housing 12 from the user.

A major drawback to the probe shown in FIG. 1 is that the probing tip 22 is not replaceable. FIG. 2 shows the structure of the holder 16 that is secured into the tubular housing 12. The holder 16 has an outer flange 38 that abuts against the tubular housing 12 when the holder 16 is inserted into the housing. Extending from the flange 38 is a circular support member 40 that is received in the tubular housing 12. Because of the position of the substrate 14 within the housing 12, the lower portion of the support member 40 is removed to provide clearance for the holder 16. To allow the holder 16 to be inserted into the housing 12 in two positions, the upper portion of the support member 40 is also is also removed. This weakens the support member 40. To increase the strength of the support member 40, the rounded inner surfaces are thickened to produce opposing approximate half-mooned shaped support members 42 having parallel surfaces 44. The resulting shape of the support member 40 requires precise alignment of the holder 16 in the tubular housing 12. The parallel surfaces 44 need to be positioned perpendicular to the top surface of the substrate 14. Positioning the parallel surface 44 in a non-vertical position causes the support member 40 to hit the substrate 14 causing irreparable damage. Precisely aligning the holder 16 in the tubular housing 12 requires the use of a microscope and special fixturing that is not available to a user. Not being able to replace broken probing tips on such probes becomes expensive for customers with such probes costing in the $3,000 range.

What is needed is a replaceable probe tip holder and an associated probe head for a measurement probe. The probe tip holder should be easily replaceable without a need for special tools, fixturing or microscopes. The holder and associated probe head configuration should minimize the probe tip capacitance to provide a wide bandwidth, high frequency measurement probe.

SUMMARY OF THE INVENTION

Accordingly, the present invention is a replaceable probe tip holder for a measurement probe head. The probe tip holder includes a cap and attachment arms extending from the back end of the cap that are positionable on the outside of a tubular housing of the probe head. The back end of the cap has a first cavity formed therein that is sized to receive a portion of the front end of the tubular housing. A second cavity extends from the first cavity and is sized to receive a portion of a substrate that extends beyond the front end of the housing. At least a first bore is formed in the cap from the second cavity to the front end of the cap. Each attachment arm may include a latching member in the form of a protrusion or an aperture. The protrusions are formed on inward facing surfaces of the attachment arms and are circular in form with each protrusion having an angled surface extending from the surface of the attachment arm to a top surface of the protrusion. The probe tip holder may also be configured with a second bore formed from the second cavity to the front end of the cap and disposed adjacent to the first bore. At least a first probe tip cavity may also be formed in the cap extending from the second cavity and sized to receive a first resilient compression member with the first bore formed from the probe tip cavity to the front end of the cap. A second probe tip cavity may also be formed in the cap that is disposed adjacent to the first probe tip cavity and extends from the second cavity with a second bore formed from the second probe tip cavity to the front end of the cap. The probe tip cavity is sized to receive a second resilient compression member. In the preferred embodiment of the present invention the center to center separation of the first and second bores is in the range of 0.100 inches. The depth of the first cavity in the range of 0.165 inches and the depth of the second cavity is in the range of 0.100 inches. The resilient compression member is preferably a nonconductive elastomer. A first electrically conductive probe tip having a shank and a head with the shank is positioned within the cap such that the head is in contact with the first resilient compression member and the shank extends through the first bore with the end of the shank extending from the front end of the cap. A second electrically conductive probe tip configured the same as the first probe tip is positioned within the cap such that the head is in contact with the second resilient compression member and the shank extends through the second bore with the end of the shank extending from the front end of the cap.

A high frequency measurement probe head incorporating the replaceable probe tip holder has an elongate tubular housing with a front end and a back end. A substrate is disposed in the housing with a portion of the substrate extending beyond the front end of the housing. The portion of the substrate extending beyond the front end of the housing has a front surface with at least a first electrically conductive contact disposed thereon. The probe tip holder has a cap with a front end and a back end. A first cavity formed in back end of the cap is sized to receive a portion of the front end of the housing. A second cavity extends from the first cavity and is sized to receive the portion of the substrate extending beyond the front end of the housing. At least a first probe tip cavity extends from the second cavity with a bore formed from the probe tip cavity to the front end of the cap. At least a first resilient compression member is disposed in the first probe tip cavity. At least a first electrically conductive probe tip having a shank and a head is positioned within the cap such that the head is in contact with the first resilient compression member and the shank extends through the bore with the end of the shank extending from the front end of the cap and the probe tip head making electrical contact with the first electrically conductive contact on the substrate. The holder includes attachment arms extending from the back end of the cap that are positionable on the outside of the housing.

The probe head may further include a latching arrangement having at least a first protrusion member and an aperture member capable of receiving the protrusion member. One of the protrusion member and aperture member is formed in each of the attachment arms and the other of the protrusion member and aperture member is formed on opposing sides in the elongate tubular housing. The protrusion member is preferably circular in form and has a base and top surface and an angled surface extending from the base to the top surface. The tubular housing is preferably rectangular in shape having recessed channels formed on opposing sides of the rectangular shaped tubular housing. The latching arrangement has one of the protrusion member and aperture member formed in each of the attachment arms and the other of the protrusion member and aperture member formed in each of the recessed channels of the elongate tubular housing.

The probe head may further include a second probe tip cavity extending from the second cavity and disposed adjacent to the first probe tip cavity with a bore formed from the second probe tip cavity to the front end of the cap. A second resilient compression member is disposed in the second probe tip cavity and a second electrically conductive probe tip having a shank and a head is positioned within the cap such that the head is in contact with the second resilient compression member and the shank extends through the second bore with the end of the shank extending from the front end of the cap. The respective resilient compression members are preferably formed from a nonconductive elastomer. The first and second electrically conductive probe tips are separated by a distance in the range of 0.100 inches. The first cavity has a depth in the range of 0.165 inches and the second cavity has a depth in the range of 0.100 inches. The front end surface of the substrate extends beyond the front end of the housing in a range of 0.100 inches.

The objects, advantages and novel features of the present invention are apparent from the following detailed description when read in conjunction with appended claims and attached drawings.

DETAILED DESCRIPTION OF THE PREFERRED EMBODIMENT

Figure 3:
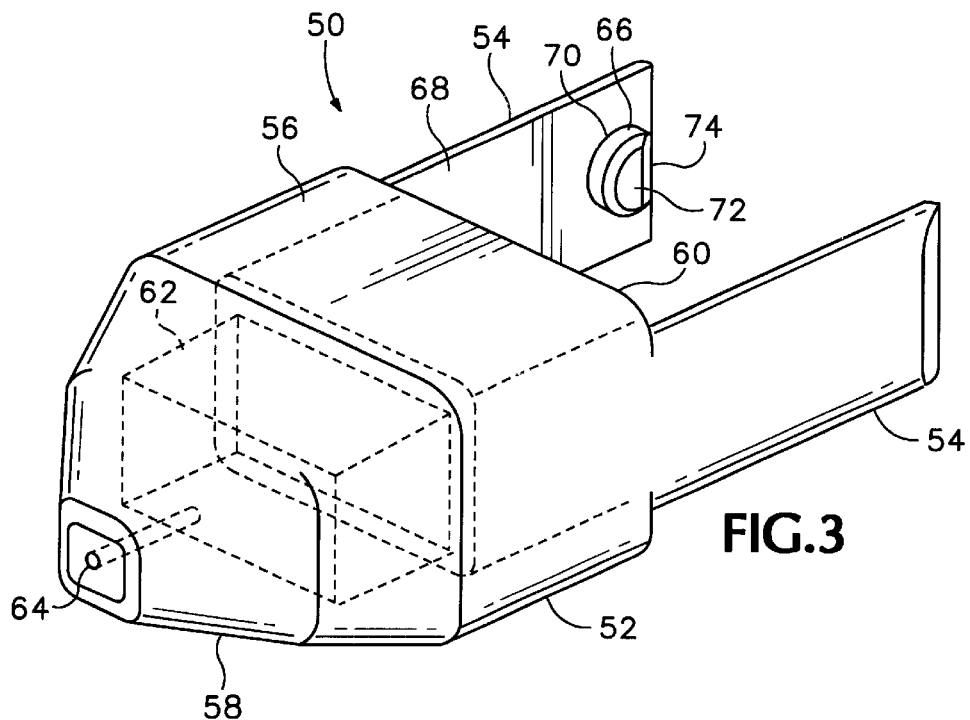
FIG. 3 is a first embodiment of the probe tip holder according to the present invention.

Referring to FIG. 3, there is shown a first embodiment of the replaceable probe tip holder 50 for a measurement probe. The probe tip holder 50 has a cap 52 and attachment arms 54 extending from the back end of the cap 52. The holder 50 attaches to a probe head (not shown) of the measurement probe which includes a substrate disposed within a tubular housing. A portion of the substrate extends beyond the front end of the tubular housing. The cap 52 has a rear portion 56 that is rectangular in shape tapering down in four dimensions to a front portion 58 at the front end. The back end of the cap 52 has a first cavity 60 formed therein that is sized to receive a portion of the front end of the tubular housing. A second cavity 62 extends from the first cavity and is sized to receive the portion of the substrate that extends beyond the front end of the tubular housing. A bore 64 is formed from the second cavity 62 to the front end of the cap 52.

In the preferred embodiment, the attachment arms 54 extend from the opposite sides of the cap 52 and have latching members 66 formed on the inward facing surfaces 68 of the arms. The latching members 66 are preferably protrusions that are circular in form and have a base 70 disposed on the attachment arm and a top surface 72. An angled surface 74 is provided on the latching member 66 that extends from the base 70 to the top surface 72 of the protrusion. Alternately, the latching members 66 may be apertures formed in the opposing attachment arms 54. The latching members 66 provide a positive attachment of the probe tip holder 50 to the tubular housing of the probe head. The probe tip holder may also be constructed without the latching members 66. In such an embodiment, the probe tip holder 50 is secured to the tubular housing by a movable boot that is positioned over the tubular body and the attachment arms.

Figure 1:
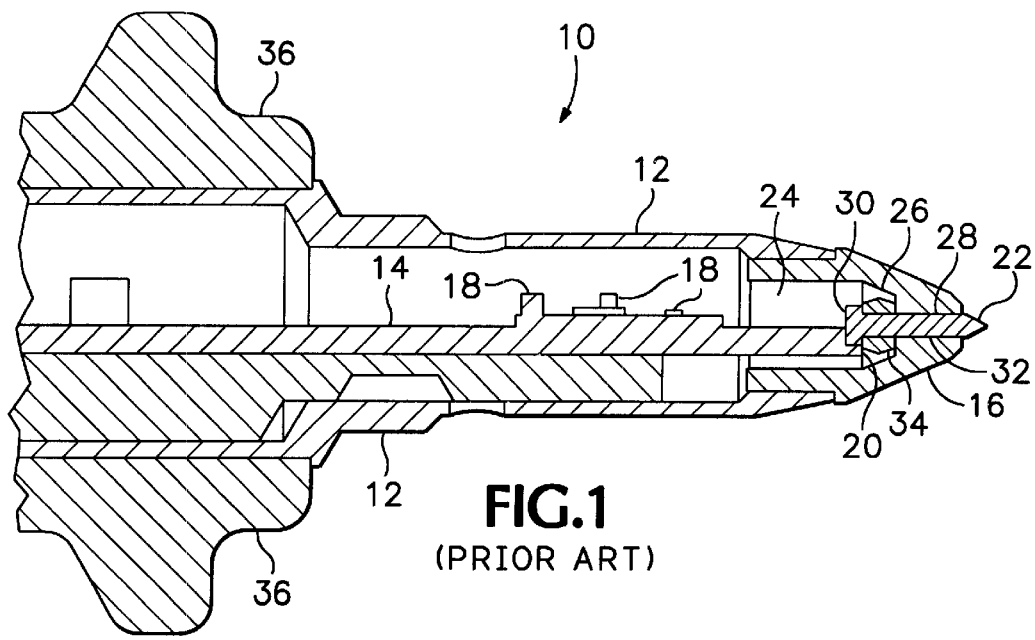
FIG. 1 is a cross-sectional view of a prior art high frequency measurement probe with a non-replaceable prove tip.
Figure 2:
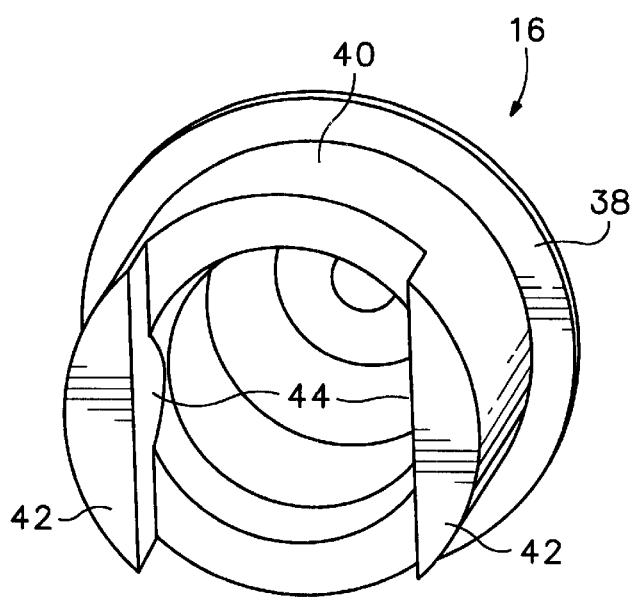
FIG. 2 is a perspective end view of the probe tip holder in the prior art high frequency measurement probe.
Figure 4:
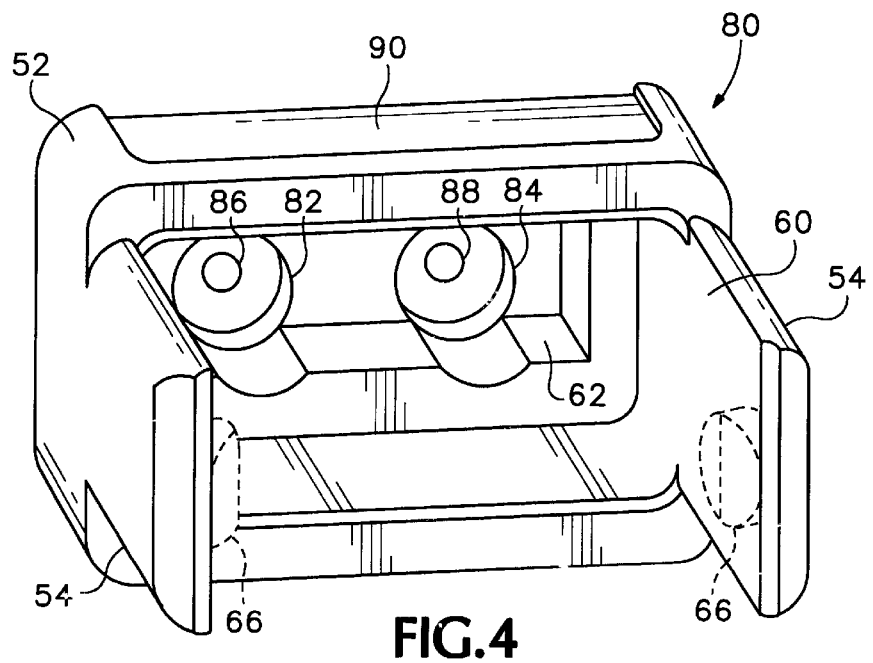
FIG. 4 is a second embodiment of a differential probe tip holder according to the present invention.

Referring to FIG. 4, there is shown a rear view of a second and preferred embodiment of the replaceable probe tip holder 80 for a measurement probe. Like elements in FIG. 4 are labeled the same as FIG. 3. The probe tip holder 80 has a cap 52 and attachment arms 54 extending from the back of the cap 52. The back end of the cap 52 has a first cavity 60 formed therein that is sized to receive a portion of the front end of the tubular housing. A second cavity 62 extends from the first cavity 60 and is sized to receive the portion of the substrate that extends beyond the front end of the tubular housing. Extending from the second cavity 62 are probe tip cavities 82, 84. In the preferred embodiment, there are two probe tip cavities providing differential probing of a device under test. Alternately, there may be a single probe tip cavity that would be incorporated into the probe tip holder of the embodiment of FIG. 3. The probe tip cavities 82, 84 have a conical shape with a larger first diameter at the second cavity interface and a smaller diameter at the bore interface. Bores 86, 88 are formed from the probe tip cavities 82, 84 to the front end of the cap 52. Latching members 66 are formed on or in the attachment arms 54 as previously described for FIG. 2. Alternately, the probe tip holder 80 may be constructed without the latching members 66 as previously described. The cap 52 may also be implemented with a recess 90 formed in the top surface for affixing a label and/or a covering material that covers apertures in the probe tip holder 50, 80 for providing access to the substrate in the tubular housing.

The probe tip holders 50, 80 of FIGS. 3 and 4 are formed of an insulating material, such as a polycarbonate, plastic or the like. In the preferred embodiment, the cap 52 has an overall width of 0.300 inches, a height of 0.190 inches and a length of 0.350 inches. The attachment arms 54 have a length of 0.276 inches. The first cavity 60 has a width of 0.255 inches, a height of 0.130 inches and a depth of 0.165 inches. The second cavity 62 has a width of 0.208 inches, a height of 0.070 inches and a depth of 0.100 inches. The probe tip cavities 82, 84 have a first diameter at the second cavity interface of 0.058 inches and a second diameter at the bore interface of 0.052 inches and a depth of 0.025 inches. The bores 64, 84, 86 have a diameter of 0.019 inches and a length of 0.060 inches. The center to center separation of the bores 84, 86 is 0.100 inches. The above dimensions are exemplary in nature and other dimensions may be used without departing from the scope of the present invention. Further, the probe tip holders 50, 80 have been described as having a rectangular shape but other shapes, such as circular, square and the like may also be used in implementing the probe tip holder of the present invention. In such alternate shapes, it is preferable to change the shape of the tubular housing of the probe head to match the shape of the probe tip holder.

Figure 5:
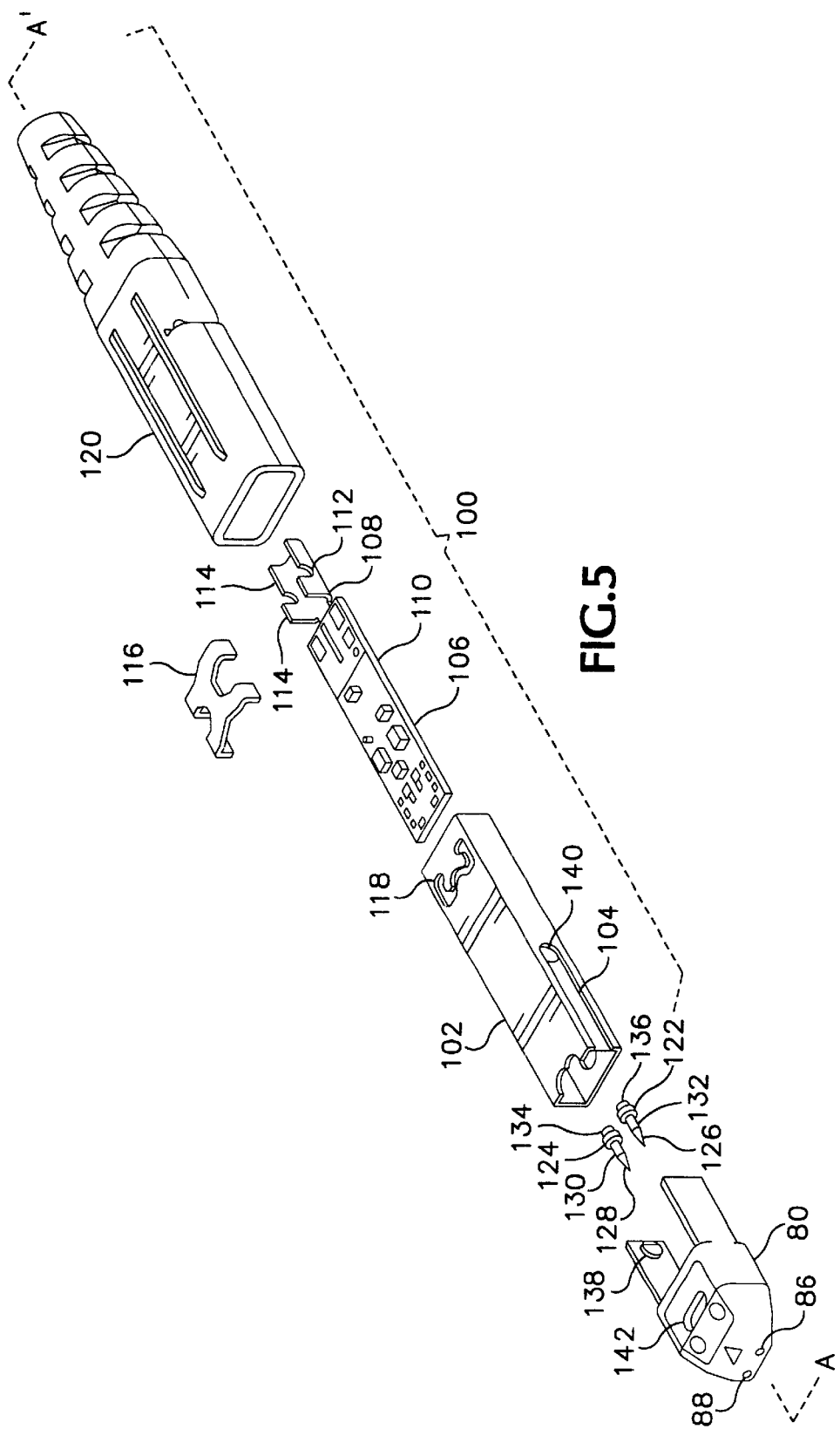
FIG. 5 is an exploded perspective view of the probe tip holder and associated probe head according to the present invention.

Referring to FIG. 5, there is shown an exploded perspective view of the probe tip holder 80 of FIG. 4 and associated probe head 100 of a wide bandwidth, high frequency measurement probe. The probe head 100 has a rectangular shaped electrically conductive tubular housing 102 having channels 104 formed on opposing sides of the housing at the front end. A substrate 106 is mounted on a carrier 108 having a first flat portion 110 on which the substrate 106 is mounted on and a second flat portion 112 with upward extending tab portions 114 for receiving a transmission cable (not shown). The transmission cable couples an acquired signal from a device under test to a measurement instrument, such as an oscilloscope, logic analyzer or the like. An electrically neutral internal alignment fixture 116 is secured to the substrate 106 prior to inserting the substrate into the tubular housing 102. The alignment fixture 116 accurately holds and positions the substrate 106 within the tubular housing 102. The substrate 106 is disposed within the housing 102 with a portion of the substrate extending beyond the front end of the housing. In the preferred embodiment, the substrate 106 extends approximately 0.10 inches past the end of the tubular housing 102. Such placement of the substrate 106 lowers the tip capacitance of the probe head 100. A tab 118 is formed in the top surface of the tubular housing 102 and is bent down to engage the tabs 114 on the carrier 108 to lock the carrier in the tubular housing 102 and provide mechanical strain relief for the transmission cable. A movable electrically insulating boot 120 is positioned over the tubular housing 102.

The probe tip holder 80 receives resilient compression members 122, 124, such as formed of a nonconductive elastomer, nonconductive spring material or the like, that are positioned within the respective probe tip cavities 82, 84. First and second electrically conductive probe tips 126, 128, each having a shank 130, 132 and a head 134, 136, are is positioned within the holder 80. The probe tips 126, 128 are inserted into the holder 80 with the shank 130, 132 of each probe tip disposed within the first and second bores 86, 88 in the cap 52 and the ends of the shanks extending from the front end of the cap 52. The resilient compression members 122, 124 are captured within the respective probe tip cavities 82, 84 by the probe tip heads 134, 136. The probe tip holder 80 is positioned on the tubular housing 102 with the extension arms 54 of the holder engaging the channels 104 in the housing 102. In the preferred embodiment, the probe head 100 has a latching arrangement that includes protrusions 138 and apertures 140. The distal ends of the channels 104 have apertures 140 formed therein that receive the protrusions 138 formed on the inner surfaces of the attachment arms 54. Alternately, the distal ends of the channels 104 may have protrusions formed therein that engage apertures formed in the attachment arms 54. The latching arrangement may also be omitted from the probe head 100 and the boot 120 may be used to secure the probe tip holder 80 to the tubular housing 102. The figure also shows the probe tip holder 80 having at least a first aperture 142 formed therein. The aperture 142 allows access to the substrate 106 with the probe tip holder 80 attached to the tubular housing 102 for trimming the components on the substrate 106 for optimum performance of the measurement probe.

Figure 6:
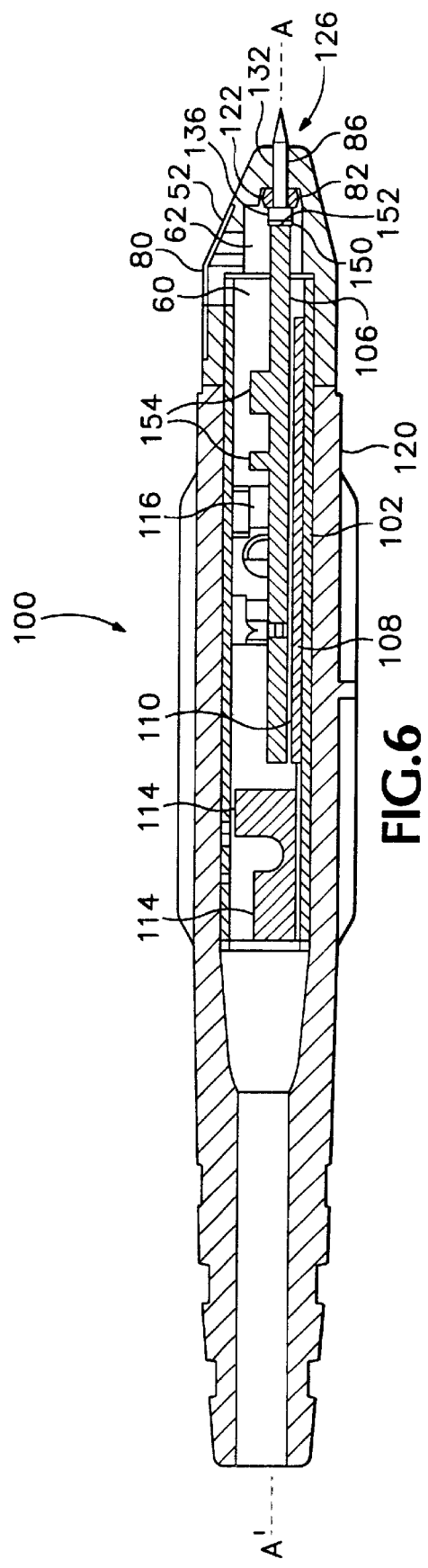
FIG. 6 is a cross-sectional view along line A–A' of a high frequency measurement probe head and probe tip holder according to the present invention.

Referring to FIG. 6, there is a cross-section view along line A–A' of the probe tip holder 80 and associated probe head 100 according to the present invention. The movable electrically insulating boot 120 surrounds a substantial portion of the electrically conductive tubular housing 102 and extends past the back end of the housing to provide strain relief to the transmission cable (not shown) connected to the substrate 106 in the housing. The carrier 108 has upward extending tabs 114 and a flat surface 110 on which the substrate 106 is mounted. The substrate 106 extends past the end of the carrier 108 and also past the front end of the tubular housing 102. The alignment fixture 116 accurately positions and holds the substrate in the housing. The substrate 106 has a gold foil contact 150 disposed on the front end surface 152 of the substrate 106 and passive and active electrical components 154 mounted on the top surface of the substrate 106. The probe tip holder 80 is mounted on the front end of the probe head 100 with a portion of the tubular housing 102 disposed within the first cavity 60 of the holder 80 and the end of the holder abutting the movable boot 120. The substrate 106 extends into the second cavity 62 and engages the head 136 of the probing tip 126. The resilient compressive member 122 is disposed within the probe tip cavity 82 and provides positive bias pressure on the probe tip head 136 for making positive electrical contact between the gold foil contact 150 on the end of the substrate 106 and the probe tip head 136. The shank 132 of the probe tip 126 extends through the bore 86 in the cap 52 of the holder 80 and is exposed at the front end of the cap 52.

A damaged probe tip 124, 126 may be replaced by sliding the insulating boot 120 back away from the probe tip holder 80 to expose the attachment arms 54 positioned along the opposing sides of the tubular housing 102. The attachment arms 54 are spread apart to release the protrusions 138 and apertures 140 of the latching arrangement. The probe tip holder 80 is removed by sliding the holder away from the tubular housing 102 in a direction parallel with the axis of the housing. A new probe tip holder containing undamaged probe tips is slid on the tubular housing 102 by aligning the attachment arms 54 with the channels 104 in the opposing sides of the tubular housing 102 and sliding the holder 80 toward the housing. The tubular housing 102 engages the first cavity 60 prior to the substrate 106 entering the second cavity 62. This minimizes the damage potential of the substrate 106 hitting the interface between the first and second cavities 60 and 62. As the holder 80 slides along the tubular housing 102, the exposed portion of the substrate 106 enters the second cavity 62 and comes in contact with the probe tip head 134, 136. Continued movement of the holder 80 compresses the resilient compression member 124, 126 producing a biased mating contact between the substrate 106 and the probe tips 126, 128. As the resilient compression members 122, 124 are compressed, the protrusions 138 and apertures 140 of the latching arrangement engage each other to secure the probe tip holder 80 onto the probe head 100. The boot 120 is repositioned onto the housing 102 in an abutting relationship with the back end of the holder 80.

A replaceable probe tip holder and associated high frequency probe head have been described. The probe tip holder had a cap and attachment arm extending from the back end of the cap. The probe tip holder is positioned on the probe head with the attachment arms positioned on the outside of the probe head. The probe has an elongate electrically conductive tubular housing having a substrate disposed therein. The front end of the substrate extends beyond the front end of the housing and has an electrical contact formed thereon. The cap has a first cavity formed in the back end that receives a portion of the front end of the tubular housing. A second cavity extends from the first cavity and receives the portion of the substrate extending beyond the tubular housing. A bore is formed in the cap from the second cavity to the front end of the cap that receives a probing tip. The probing tip has a shank and a head with the shank extending through the bore with the end of the shank being exposed at the front end of the cap. A resilient compression member is positioned between the probe tip head and the bore to provide a compressive bias between the head and the contact on the substrate. The holder may also include a latching arrangement that includes protrusion members and an aperture members. One of the protrusion members and aperture members is disposed on each of the attachment arms and the other of the protrusion members and aperture members is disposed on opposing sides of the tubular housing. Channels are preferably formed on opposing sides of the tubular housing for receiving the attachment arms. The probe tip holder may also include a probe tip cavity that receives the resilient compression member. The bore in the cap then extends from the probe tip cavity to the front end of the cap. The probe tip holder may also be configured with two probe tips for performing differential probing measurements. A second bore is formed in the cap adjacent to the first bore and a second probe tip in positioned through the bore. A second resilient compression member is provided with the second probe tip and a second probe tip cavity may be formed within the cap.

It will be obvious to those having skill in the art that many changes may be made to the details of the above-described embodiments of this invention without departing from the underlying principles thereof. The scope of the present invention should, therefore, be determined only by the following claims.

What is claimed is:

1. A replaceable probe tip holder for a measurement probe head wherein the holder receives at least a first electrically conductive probe tip and a first resilient compression member with the probe tip and resilient compression member positioned within the holder such that the resilient compression member biases the probe tip in the holder and a portion of the probe tip extends outward from the holder, and the probe head has a substrate disposed within a tubular housing having a front end with a portion of the substrate exposed beyond the front end of the housing, the replaceable probe tip holder comprising:

a cap having a front end and a back end with a first cavity formed in the back end of the cap that is sized to receive a portion of the front end of the housing, a second cavity extending from the first cavity that is sized to receive the portion of the substrate extending beyond the front end of the housing and at least a first bore formed from the second cavity to the front end of the cap; and attachment arms extending from the back end of the cap that are positionable on the outside of the tubular housing.

2. The replaceable probe tip holder as recited in claim 1 wherein each attachment arm includes a latching member.

3. The replaceable probe tip holder as recited in claim 2 wherein the latching members comprise protrusions formed on inward facing surfaces of the attachment arms.

4. The replaceable probe tip holder as recited in claim 3 wherein the protrusions are circular in form with each protrusion having an angled surface extending from the surface of the attachment arm to a top surface of the protrusion.

5. The replaceable probe tip holder as recited in claim 2 wherein the latching members comprise apertures formed in the attachment arms.

6. The replaceable probe tip holder as recited in claim 1 further comprising a second bore formed from the second cavity to the front end of the cap and disposed adjacent to the first bore.

7. The replaceable probe tip holder as recited in claim 1 further comprising at least a first probe tip cavity extending from the second cavity and sized to receive the first resilient compression member with the first bore formed from the probe tip cavity to the front end of the cap.

8. The replaceable probe tip holder as recited in claim 7 further comprising a second probe tip cavity disposed adjacent to the first probe tip cavity and extending from the second cavity and sized to receive a second resilient compression member with a second bore formed from the second probe tip cavity to the front end of the cap.

9. The replaceable probe tip holder as recited in claim 8 wherein the center to center separation of the first and second bores is in the range of 0.100 inches.

10. The replaceable probe tip holder as recited in claim 1 wherein the first cavity has a depth in the range of 0.165 inches.

11. The replaceable probe tip holder as recited in claim 1 wherein the second cavity has a depth in the range of 0.100 inches.

12. A replaceable probe tip holder for a measurement probe head having a substrate disposed within a tubular housing having a front end with a portion of the substrate exposed beyond the front end of the housing comprising:
- a cap having a front end and a back end with a first cavity formed in the back end of the cap that receives a portion of the front end of the housing, a second cavity extending from the first cavity that receives the portion of the substrate extending beyond the front end of the housing and at least a first probe tip cavity extending from the second cavity with a bore formed from the probe tip cavity to the front end of the cap;
- at least a first resilient compression member disposed in the first probe tip cavity;
- at least a first electrically conductive probe tip having a shank and a head with the shank positioned within the cap such that the head is in contact with the first resilient compression member and the shank extends through the bore with the end of the shank extending from the front end of the cap; and
- attachment arms extending from the back end of the cap that are positionable on the outside of the housing.

13. The replaceable probe tip holder as recited in claim 12 wherein each attachment arm includes a latching member.

14. The replaceable probe tip holder as recited in claim 13 wherein the latching members comprise protrusions formed on inward facing surfaces of the attachment arms.

15. The replaceable probe tip holder as recited in claim 14 wherein the protrusions are circular in form with each protrusion having an angled surface extending from the surface of the attachment arm to a top surface of the protrusion.

16. The replaceable probe tip holder as recited in claim 13 wherein the latching members comprise apertures formed in the attachment arms.

17. The replaceable probe tip holder as recited in claim 12 wherein the resilient compression member is a nonconductive elastomer.

18. The replaceable probe tip holder as recited in claim 12 further comprising;
- a second probe tip cavity extending from the second cavity and disposed adjacent to the first probe tip cavity with a bore formed from the second probe tip cavity to the front end of the cap;
- a second resilient compression member disposed in the second probe tip cavity;
- a second electrically conductive probe tip having a shank and a head with the shank positioned within the cap such that the head is in contact with the second resilient compression member and the shank extends through the second bore with the end of the shank extending from the front end of the cap.

19. The replaceable probe tip holder as recited in claim 18 wherein the first and second electrically conductive probe tips are separated by a distance in the range of 0.100 inches.

20. The replaceable probe tip holder as recited in claim 12 wherein the first cavity has a depth in the range of 0.165 inches.

21. The replaceable probe tip holder as recited in claim 12 wherein the second cavity has a depth in the range of 0.100 inches.

22. A high frequency measurement probe head comprising:
- an elongate tubular housing having a front end and a back end;
- a substrate having a front surface with at least a first electrically conductive contact disposed on the front end surface, the substrate being disposed in the housing with a portion of the substrate that includes the front end surface extending beyond the front end of the housing;
- a probe tip holder having a cap with a front end and a back end and a first cavity formed in back end of the cap that receives a portion of the front end of the housing, a second cavity extending from the first cavity that receives the portion of the substrate extending beyond the front end of the housing and at least a first probe tip cavity extending from the second cavity with a bore formed from the probe tip cavity to the front end of the cap;
- at least a first resilient compression member disposed in the first probe tip cavity;
- at least a first electrically conductive probe tip having a shank and a head with the shank positioned within the cap such that the head is in contact with the first resilient compression member and the shank extends through the bore with the end of the shank extending from the front end of the cap, the probe tip head making electrical contact with the first electrically conductive contact on the substrate; and
- attachment arms extending from the back end of the cap that are positionable on the outside of the housing.

23. The high frequency measurement probe head as recited in claim 22 further comprising a latching arrangement having at least a first protrusion member and an aperture member capable of receiving the protrusion member.

24. The high frequency measurement probe head as recited in claim 23 wherein one of the protrusion member and aperture member is formed in each of the attachment arms and the other of the protrusion member and aperture member is formed on opposing sides in the elongate tubular housing.

25. The high frequency measurement probe head as recited in claim 23 wherein the protrusion member is circular in form and has a base and top surface and an angled surface extending from the base to the top surface.

26. The high frequency measurement probe head as recited in claim 22 wherein the housing further comprises a rectangular shaped tubular housing having recessed channels formed on opposing sides of the rectangular shaped tubular housing.

27. The high frequency measurement probe head as recited in claim 26 further comprising a latching arrangement having at least a first protrusion member and an aperture member capable of receiving the protrusion member.

28. The high frequency measurement probe head as recited in claim 27 wherein one of the protrusion member and aperture member is formed in each of the attachment arms and the other of the protrusion member and aperture member formed in each of the recessed channels of the elongate tubular housing.

29. The high frequency measurement probe head as recited in claim 27 wherein the protrusion member is circular in form and has a base and top surface with each protrusion member having an angled surface extending from the base to the top surface.

30. The high frequency measurement probe head as recited in claim 22 wherein the resilient compression member is a nonconductive elastomer.

31. The high frequency measurement probe head as recited in claim 22 wherein the front end surface of the substrate extends beyond the front end of the housing in a range of 0.1 inches.

32. The high frequency measurement probe head as recited in claim 22 further comprising;
   a second probe tip cavity extending from the second cavity and disposed adjacent to the first probe tip cavity with a bore formed from the second probe tip cavity to the front end of the cap;
   a second resilient compression member disposed in the second probe tip cavity;
   a second electrically conductive probe tip having a shank and a head with the shank positioned within the cap such that the head is in contact with the second resilient compression member and the shank extends through the second bore with the end of the shank extending from the front end of the cap.

33. The high frequency measurement probe head as recited in claim 32 wherein the first and second electrically conductive probe tips are separated by a distance in the range of 0.100 inches.

34. The high frequency measurement probe head as recited in claim 22 wherein the first cavity has a depth in the range of 0.165 inches.

35. The high frequency measurement probe head as recited in claim 22 wherein the second cavity has a depth in the range of 0.100 inches.

* * * * *